United States Patent [19]

Kröner et al.

[11] Patent Number: 4,883,991
[45] Date of Patent: Nov. 28, 1989

[54] CIRCUIT ARRANGEMENT FOR ADJUSTING A REFERENCE LEVEL IN A PERIODIC SIGNAL

[75] Inventors: Klaus G. Kröner, Hamburg; Jörg Wölber, Pinneberg, both of Fed. Rep. of Germany

[73] Assignee: U. S. Philips Corporation, New York, N.Y.

[21] Appl. No.: 58,097

[22] Filed: Jun. 4, 1987

[30] Foreign Application Priority Data

Jun. 5, 1986 [DE] Fed. Rep. of Germany ....... 3618939

[51] Int. Cl.⁴ .......................... H03F 1/30; H03F 3/45; H03K 17/56; H03L 5/0
[52] U.S. Cl. ................................. 307/491; 307/246; 307/264; 330/254; 358/174; 358/184
[58] Field of Search ............... 307/297, 491, 246, 264; 328/26, 127; 330/247, 280, 254; 358/174, 184, 171

[56] References Cited

U.S. PATENT DOCUMENTS

| 3,396,236 | 8/1968 | Foster | 358/171 X |
| 3,557,305 | 1/1971 | Dann | 358/171 X |
| 3,740,670 | 6/1973 | Hoffman | 307/264 |
| 3,985,954 | 10/1976 | Kuniyoshi et al. | 307/553 X |
| 4,141,041 | 2/1979 | Peters | 358/174 |
| 4,242,602 | 12/1980 | Nakagawa et al. | 307/246 |
| 4,450,413 | 5/1984 | Fujibayashi | 330/279 |
| 4,465,978 | 8/1984 | Helmstetter | 307/264 |
| 4,470,066 | 9/1984 | Wölber et al. | 358/171 |
| 4,549,214 | 10/1985 | Hinn | 307/264 |
| 4,574,202 | 3/1986 | Ogawa | 307/246 |
| 4,634,902 | 2/1987 | Tanaka et al. | 307/491 |
| 4,670,787 | 6/1987 | Levine | 358/174 |

FOREIGN PATENT DOCUMENTS 3016096 11/1980 Fed. Rep. of Germany .
0121618 9/1979 Japan ................................. 358/174

Primary Examiner—Stanley D. Miller
Assistant Examiner—Huy Kim Mai
Attorney, Agent, or Firm—Edward W. Goodman

[57] ABSTRACT

A circuit arrangement for amplifying a periodic signal and for adjusting a reference level contained therein, in which a charging/discharging arrangement alternately supplies charging or discharging currents to a storage means, depending on whether the value of a periodic signal exceeds or is exceeded by a limit value, such that a mean value at least substantially corresponding to the reference level occurs at the storage means includes a compensator means which adjusts the charging and discharging currents by a compensation factor which is selected such that the ratio of the charging current to the discharging current is independent of fluctuations in current resulting from variations affecting the gain factors of amplifier components comprised in the amplifier means.

14 Claims, 5 Drawing Sheets

CIRCUIT ARRANGEMENT FOR ADJUSTING A REFERENCE LEVEL IN A PERIODIC SIGNAL

BACKGROUND OF THE INVENTION

The invention relates to a circuit arrangement for amplifying a periodic signal and for adjusting a reference level contained therein. Level a limit value stage in which the amplified signal is compared to an at least substantially constant limit value and which alternately switches a charging/discharging arrangement into either of two positions, depending on whether the value of the periodic signal exceeds or falls short of the limit value, as the case may be. The charging/discharging arrangement supplies currents for alternately charging or discharging a storage means such that a mean value at least substantially corresponding to the reference level occurs at the storage means. The circuit further comprises an amplifier stage including at least an amplifier component for amplifying the signal to which is applied the mean value of the storage means for adjusting the reference level contained in the signal.

Such a circuit arrangement is disclosed in the German patent Ser. No. DE 3.214.756 and its equivalent U.S. Pat. No. 4,470,066 for example FIG. 3 or 4 with the associated descriptions. Such circuit arrangements are preferably used as clamping circuits for processing television signals in television receivers. In contradistinction to, what is commonly referred to as, forced clamping, in which case the television signal is sampled by an external clamping pulse at short time intervals, the circuit arrangements of the type mentioned in the opening paragraph do not require an external clamping pulse and are essentially less sensitive to disturbances in the television signal. The reference level in the television signal to be adjusted can be chosen in a simple manner by fixing the ratio of the charging current to the discharging current of the storage means. Besides, for a trouble-free functioning of the circuit arrangement it is essential that this ratio between the charging and discharging currents, once it has been chosen, should not be subjected to fluctuations, as these fluctuations may be manifested as fluctuations in the reference level to be adjusted, that is to say, in a mean value occurring at the storage means.

Such fluctuations can, for example, be caused by the input current of an amplifier stage comprised in the circuit arrangement and connected to the storage means, in the case when this input current fluctuates with a signal being periodic but having a changing amplitude. Furthermore, fluctuating currents may occur as a result of production tolerances in the amplifier stage or as a result of temperature variations, specially affecting the gain factors of the amplifier components comprised in the amplifier stage. It has been shown that the latter effect can have significant repercussions.

To reduce the influence of the said fluctuations, the current for discharging the storage means therefore should be chosen to be considerably larger than the current originating from the amplifier stage and subject to said fluctuations. If, for example, the input current of the amplifier stage cannot be chosen to be as small as desired, in order not to narrow down the bandwidth of the periodic signal amplified by the amplifier stage more than allowed, a minimum value for the current for discharging the storage means is given too. This also requires a minimum value of the charging current and of the storage means, for example a capacitor, so as to be able to effect the charging of the storage means and to keep a variation in the charge on the storage means as a result of the discharging current, during a signal period, at the lowest possible value as such discharging processes distort the variation of the periodic signal.

If, for example, the periodic signal is a television signal, in which picture synchronizing signals occur in addition to line synchronizing signals determining the period, too large a deviation from the determined reference level would occur if the storage means, for example a capacitor, were too small.

On the other hand, large currents require a larger dimensioning of all components through which they pass. Storage means designed as capacitors of specific minimum dimensions particularly require a minimum floor space. Consequently, integrating the described circuit arrangement on a wafer will be harder.

SUMMARY OF THE INVENTION

The invention has for its object to form a circuit arrangement of the type mentioned in the opening paragraph, such that reduced dimensions are achieved, especially of the storage means, without any loss of accuracy on determining the reference level, whilst realizing a most complete integration of the circuit arrangement on a wafer.

The object in accordance with the invention is achieved, in that the charging/discharging arrangement applies the currents to the storage means via a compensator stage, converting the charging and/or the discharging current by a compensation factor which is selected such that the ratio of the charging current to the discharging current is independent of the gain factor.

The invention has the advantage that it is no longer necessary to choose the storage means discharge current to be considerably larger than the currents occurring at the amplifier stage, more particularly than the input currents thereof, on account of the tolerance stated before, but to let it rather be formed by a current having a value corresponding to these currents or by this current itself. In that case the compensator stage compensates for any variations in the ratio of the charging current to the discharging current caused by fluctuations or tolerances of the gain factor, so that this ratio always corresponds with a current-ratio which is set for the reference level to be determined each time. In contrast with the prior art circuits, for example the input current of the amplifier stage should no longer be reduced, so as to reduce the discharging current of the storage means. Particularly reductions of the transmission bandwidth of the amplifier stage are thus avoided.

When reducing the discharging current of the storage means and hence also the charging current thereof the components of the circuit arrangement through which these currents pass can be dimensioned to be spatially smaller, but on the other hand particularly the storage means can be adapted to the reduced currents. This implies, for example, with a storage means formed by a capacitor, which has to be integrated on a wafer together with the other portions of the circuit arrangement, a reduction of the surface area of the capacitor plates and hence a reduction of the space on the wafer required for the capacitor to such an extent that the currents for charging and discharging the capacitor are reduced.

In a further embodiment of the circuit arrangement in accordance with the invention the amplifier stage is composed of one or a plurality of transistors having a current gain from which the gain factor is derived. In an advantageous further embodiment the compensator stage comprises at least one transistor, whose current gain bears a constant ratio to the current gain of the amplifier stage and/or to the gain factor. Particularly, when the amplifier components as well as the compensator stage are integrated on a common wafer, not only influences of temperature on the current gains but also manufacturing tolerances like, for example, inaccurate positioning of etching masks or doping variations in the manufacturing process of the wafer, can be compensated for with such an arrangement, as these influences in an integrated circuit affect at least substantially all its components to the same extent. In a structure of a circuit arrangement with discrete circuit components and a subsequent adjustment of the circuit, in any case the compensation of temperature variations then required is still possible.

In a still further embodiment of the invention the storage means comprises at least a first capacitor, forming a coupling capacitor, via which the periodic signal of the amplifier stage is applied. Therewith the storage means likewise provides DC isolation, preferably inserted between the circuit arrangement in accordance with the invention and its preceding signal processing stages. Thus, in a circuit arrangement which eliminates a separate coupling capacitor, the space provided by one less component can mean considerable extra space on a wafer comprising an integrated circuit or a discrete component and a connection contact to an integrated circuit. In such a circuit arrangement the reduction of the currents for charging and discharging the storage means, that is to say the coupling capacitor, realized by means of the invention, has the advantage of achieving a reduction of the voltage drop caused by these currents in the source impedance of the signal processing stage preceding the circuit arrangement in accordance with the invention. Thus a distortion of the periodic signal caused thereby is likewise reduced considerably.

In another further embodiment of the invention the storage means comprises at least a second capacitor whose first terminal is connected to a reference point and whose second terminal is connected to a comparative value input of the amplifier stage. The second capacitor thus particularly supplies a control voltage to the amplifier stage for adjusting the operating point.

In a further embodiment of the invention the capacitance of the capacitor is chosen in proportion to the discharging current such that the charge of the capacitor is not changed appreciably during a signal period. With a given discharging current value and a maximum permissible change of the capacitor charge, the minimum value of its capacitance is determined. As a result of the reduction of the discharging current in accordance with the invention this capacitance value or the maximum permissible change of the capacitor charge can now be reduced considerably, which can also be employed for reducing the dimensions of the circuit arrangement or for reducing the errors in the periodic signal or for a combination of the two.

A further embodiment of the circuit arrangement in accordance with the invention can be as advantageous in that it comprises a first and a second capacitor whose capacitances are chosen in proportion to the associated discharging currents such that changes due to these currents during a signal period are cancelled as to their effects on the signal. In such an arrangement it is no longer required to limit the maximum permissible changes in the capacitor charge such that the influence of each change in itself does not have a noticeable effect on the periodic signal. Rather particularly larger changes can be allowed, as their effects on the signal, for example, are rendered prominent because the amplifier stage is provided as a differential amplifier and one of the capacitors is always connected to one of the inputs of this differential amplifier. With steady discharges of the two capacitors their influence at the output of the differential amplifier is suppressed. So doing, both capacitors can have considerably smaller surface areas and are even more suitable for an integration with the remaining circuit components on a wafer.

In a further embodiment of this circuit arrangement in each signal period the charging of the first capacitor is delayed with respect to the charging of the second capacitor by a specific fraction of the period of time available for the charging operation. Consequently, the second capacitor reaches its final charging condition before the first capacitor, in which condition it was at the beginning of the discharging operation. The voltage available at the second capacitor can then form a specified comparative value—for example at a comparative value input of the amplifier stage—as a result of which the charging of the first capacitor can be proceeded with exactly till a specified charging condition is reached. So the voltage on the second capacitor functions as a "stop" for the voltage on the first capacitor.

In another further embodiment of the invention an impedance transforming stage is arranged between the second terminal of the second capacitor and the comparative value input. This transforming stage can reduce the current at the comparative value input, formed for example by a transistor base, in one step or in a plurality of steps so that only a very small current is required for feeding the comparative value input. As only direct currents occur at this input, essentially, no bandwidth limitation of the amplifier stage as a result of a reduction of these currents needs to be apprehended. However, when the reduced current is taken from the second capacitor for discharging or supplied thereto, a further reduction of the size of this capacitor is made possible. It can then, for example, be co-integrated on the wafer. By doing this, the additional connecting contact required so far of the integrated circuit can be saved.

BRIEF DESCRIPTION OF THE DRAWINGS

Some embodiments of the invention are shown in the drawing and will be further described by means of the figures, in which.

DETAILED DESCRIPTION OF THE INVENTION

Figure 1:
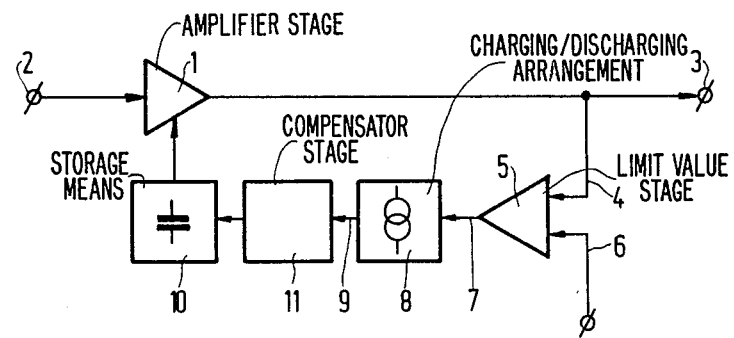
FIG. 1 shows a block diagram for explaining the structure of a circuit arrangement in accordance with the invention.

FIG. 1 shows a circuit arrangement comprising an amplifier stage 1, receiving on one input 2 a periodic signal and applying an amplified version of this signal to an output 3. The output 3 is further connected to a signal input 4 of a limit value stage 5, which further receives an at least substantially constant limit value on a limit value input 6. Depending on whether the signal at the signal input 4 exceeds or falls short of the limit value, the limit value stage 5 supplies at an output 7 a switching signal, assuming either of two states, as a result of which a charging/discharging arrangement 8, for example a switchable current source is alternately switched in one of two positions, in which the source supplies at its output 9 a current for charging and discharging, respectively, a storage means 10. The storage means 10, for example, is formed by a capacitor charging itself at a voltage corresponding to a reference level contained in the periodic signal. Thereto, the ratio of the currents delivered by the charging/discharging arrangement 8 has to assume a specific value. The reference level from the storage means 10 is applied to the amplifier stage 1 and preferably sets a DC operating point there.

The circuit arrangement of FIG. 1, minus compensator stage 11, is known from German Pat. No. DE 3.214.756 (U.S. Pat. No. 4,470,066). A compensator stage 11 in accordance with the invention is shown inserted between the output 9 of charging/discharging arrangement 8, and storage means 10. As further shown in the embodiments described in detail hereinafter, a compensation takes place in the compensator stage 11 whose current for discharging the storage means 10 depends on the gain ratio of the amplifier stage 1, such that the ratio of the current for charging the storage means to the current for discharging the storage means is independent of the gain factor. Thereto, one of the two currents or both of them can be multiplied by, for example, the gain factor or the reciprocal value thereof such that the ratio of the currents is a constant value.

Figure 2:
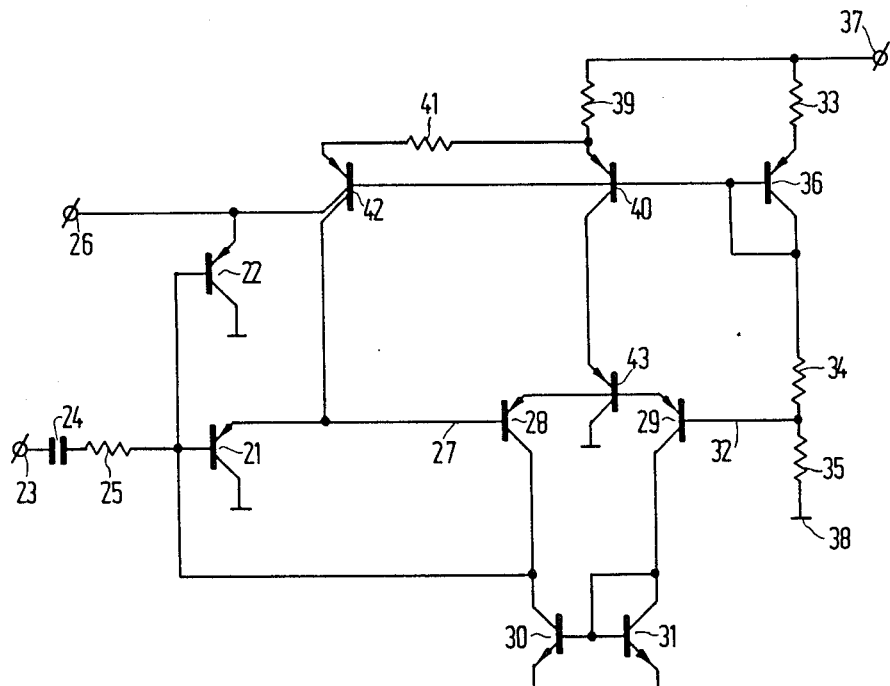
FIG. 2 shows a simple embodiment of the invention.

FIG. 2 shows a simple embodiment of the invention of such a circuit arrangement. In this embodiment two transistors 21, 22 form the amplifier stage 1, which receives at an input 23 the periodic signal. The input branch of the amplifier stage 21, 22 comprises a (first) capacitor 24, which forms a storage means as well as a coupling capacitor for DC isolation. This coupling capacitor is connected in series with a series resistor 25 for adapting the input resistance of the circuit arrangement shown to the output resistance of a preceding signal processing arrangement (not shown) connected to the input 23.

The periodic signal from the input 23 is amplified by the transistor 22 and applied to an output 26. For decoupling this output 26 from the remaining circuit components the periodic signal is furthermore amplified by the transistor 21 and applied to a signal input 27 of the limit value stage constituted by four transistors 28 to 31. This limit value stage is further connected via a limit value input 32 to a tap of a voltage divider having three resistors 33 to 35 and a transistor 36 acting as a diode. The voltage divider lies between the supply voltage terminals 37 and 38. From the voltage divider further supply currents are derived for the amplifier stage 21, 22 and the limit value stage 28 to 31 via a resistor 39 and a current source transistor 40 on the one hand and a further resistor 41 and a further current source transistor 42, having two collectors for supplying transistors 21, 22, on the other.

The currents flowing from the current source transistor 42 to the first capacitor 24 via the base-emitter paths of transistors 21, 22 depend on the current gains of the transistors 21, 22. Whilst the first capacitor 24 is discharging, apart from these currents a current will flow from the base connections of the transistors 21, 22 via the collector-emitter path of the transistor 30 to ground. The difference of these currents forms the discharging currents of the first capacitor 24. As the transistors 30 and 31 form a current mirror circuit, the current through the transistor 30 is determined by the current delivered by the current source transistor 40. The current through the transistor 30 is at least partially eliminated by the currents at the base connections of the transistors 21, 22, as a result of which the discharging current of the first capacitor 24 can be smaller than these base currents.

Whilst the first capacitor 24 is charging in the periods of time in which the voltage at the signal input 27 falls short of the voltage at the limit value input 32, a current will flow from the collector of the current source transistor 40 via transistor 28 into the first capacitor 24. As the transistor 29 is rendered non-conductive now, current will not flow through the transistor 31 and due to the current mirror circuit not to the transistor 30 either. The first capacitor 24 is thus charged with the overall current delivered by the transistor 28.

If the collector of the current source transistor 40 were directly connected to the emitters of the transistors 28, 29 of the limit value stage 28 to 31, the resulting ratio of the charging current to the discharging current would depend on the current gain of the transistors whilst assuming fixed charging and discharging times for the first capacitor as well as a fixed reference level. Consequently, a compensator stage is inserted between the current source transistor 40 and the limit value stage 28 to 31. This compensator stage consists of a transistor 43 whose emitter receives the current from the current source transistor 40 and delivers the base current reduced by the current gain to the limit value stage 28 to 31. Thus, the current gain is incorporated in the current ratio as an additional factor, compensating for the dependence on the current gain of the transistors 21, 22 forming the amplifier stage. The charging/discharging current ratio is now constant, that is to say, not depending on manufacturing tolerances and temperature.

The circuit arrangement according to FIG. 2 mainly comprises bipolar PNP-transistors. When, accordingly, changing the polarity of the supply voltages, a corresponding circuit arrangement comprising NPN-transistors can be produced.

Figure 3:
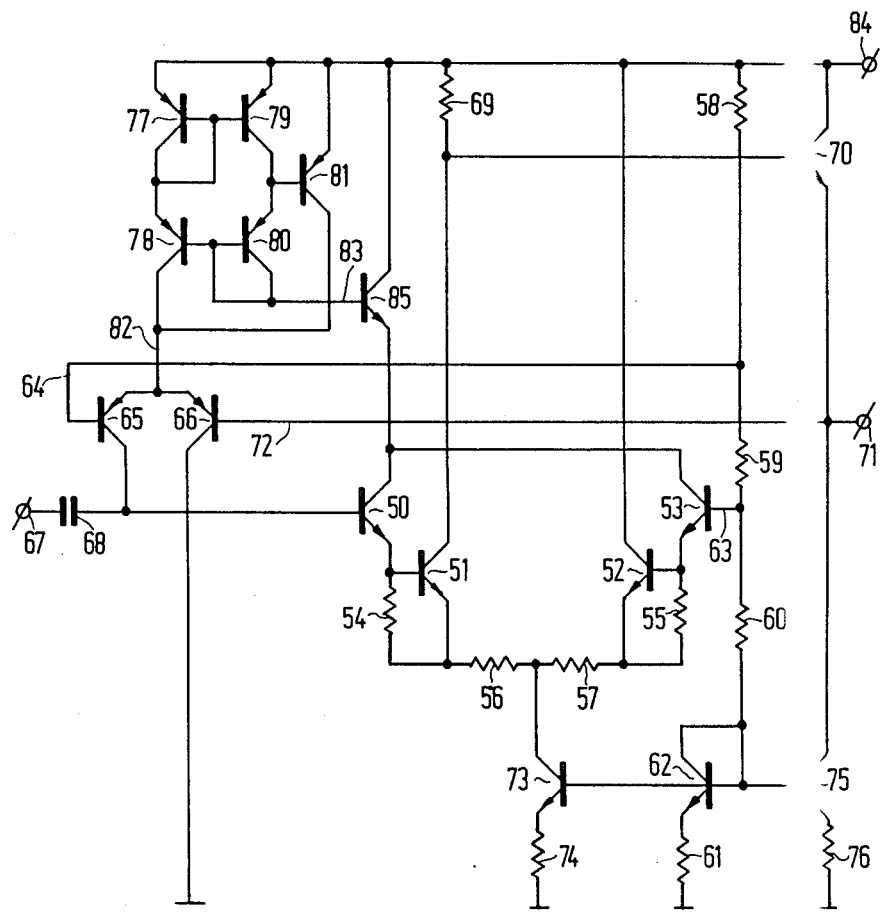
FIG. 3 and FIG. 4 show two embodiments in which the storage means likewise functions as a coupling capacitor.

FIG. 3 shows a further embodiment of the invention in which the amplifier stage is formed by a two-stage differential amplifier comprising four transistors 50 to 53 as well as four resistors 54 to 57. A voltage divider formed by four resistors 58 to 61 and a transistor 62 acting as a diode delivers at a number of associated taps constant voltage values to a comparative value input 63 of the differential amplifier 50 to 57 and to a limit value input 64 of a limit value stage formed by two transistors 65, 66. From an input 67 the periodic signal is supplied to the differential amplifier 50 to 57 via a (first) capacitor 68 serving as storage means and coupling capacitor. In this differential amplifier this signal is successively amplified by the transistors 50 and 51 and delivered via a load resistor 69 and an output transistor 70 to an output 71, from where it also flows to a signal input 72 of the limit value stage 65, 66. A combination of a transistor 73 and 75 respectively with an emitter resistor 74 and 76 respectively, controlled via the transistor 62 acting as a diode of the voltage divider 58 to 62, forms a current source for the differential amplifier 50 to 57 and the output stage transistor 70, respectively.

In the present circuit arrangement the discharging current of the first capacitor 68 flows to ground passing through that half of the differential amplifier 50, 51, 54, 56 which is connected to the input and through the current source 73, 74. Thus, the input current of the differential amplifier 50 to 57 is directly used as the discharging current of the first capacitor 68. The voltage at the output 71 and hence at the signal input 72 of the limit value stage 65, 66 is then lower than the voltage at the limit value input 64. It should be noted, that the signal at the output 71 is inverted with respect to the one at input 67. The transistor 65 is rendered non-conductive; so only a discharging current of the first capacitor 68 will flow. A current flowing via the junction point of the emitter connections of transistors 65, 66 in the limit value stage is led to ground via the transistor 66.

The circuit arrangement further comprises a current mirror circuit composed of five transistors 77 to 81, on the one hand connected to a supply voltage terminal 84 and on the other to a first and a second output 82 and 83. Similar current mirror circuits are, for example, disclosed in the DE-AS 24 34 947. The currents taken off at the outputs 82, 83 have a specific ratio to one another which can be influenced by the geometries of the transistors 77 to 81.

Whilst the first capacitor 68 is being charged, the voltage at the signal input 72 of the limit value stage 65, 66 exceeds the limit value of the limit value input 64. In that case the transistor 66 has assumed the non-conductive stage. The first capacitor 68 is charged by a current delivered by the current mirror circuit 77 to 81 via the first output 82. This current has a constant ratio to the current available on the second output 83. This current is derived from the sum of the collector currents of the transistors 50 and 53 of the differential amplifier 50 to 57 via the compensator stage 85 which is likewise formed by a transistor. As the collector current of transistor 50 by means of the current gain continues to be combined to the discharging current of the first capacitor 68 flowing via its base, and as the current taken from the second output 83 of the current mirror circuit 77 to 81 has an inverse proportion to the collector current of transistor 50 with respect to the current gain (of the compensator stage 85), the ratio of the charging current received via the transistor 65 to the discharging current via the base of the transistor 50 is independent of the current gain. Thus, in this circuit arrangement only the current for charging the first capacitor 68 is made dependent on the current gain.

Figure 4:
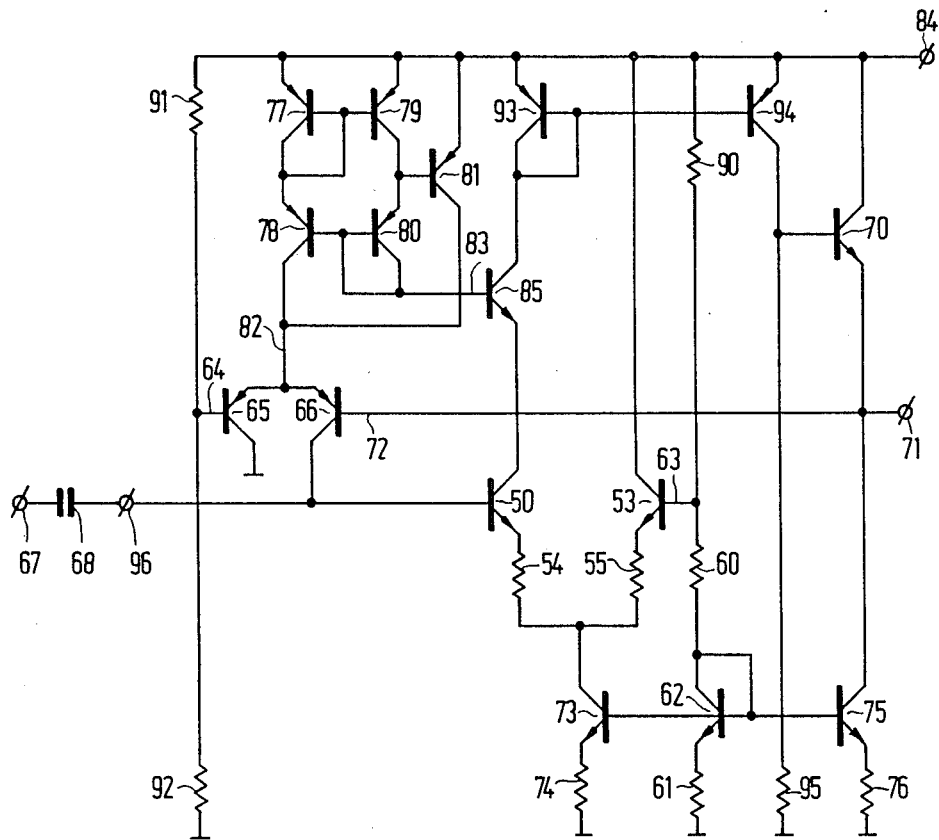

In FIG. 4 is shown a circuit arrangement similar to the one shown in FIG. 3, which is designed for the noninverting transmission of a periodic signal from the input 67 to the output 71. Circuit components corresponding to those in FIG. 3 are indicated by corresponding reference numbers. The limit value stage 65, 66, with its limit value input 64 and its signal input 72, the current mirror circuit 77 to 81 with its outputs 82, 83, the supply-voltage terminal 84 as well as the output transistor 70 have been borrowed essentially unchanged from the circuit arrangement according to FIG. 3. On the other hand, the present circuit arrangement comprises a mere one-stage differential amplifier 50, 53, 54, 55 having a comparative value input 63. This arrangement is substantially equal to the first stage of the differential amplifier of the circuit arrangement according to FIG. 3. Also the current sources 73, 74, and 75, 76 have been borrowed unchanged; these sources and the comparative value input 63 are fed from the partially modified voltage divider comprising three resistors 60, 61, 90 and the transistor 62 acting as a diode. The limit value input 64 of the limit value stage 65, 66 is now supplied via a specific limit value voltage divider composed of two resistors 91 and 82, providing a voltage of the specific limit value.

The signal supplied via the input 67 and the first capacitor 68 to the differential amplifier 50, 53, 54, 55, is amplified by the transistor 50 and fed to the output transistor 70 via a transistor pair 93, 94 operating as a current mirror circuit, and to the output 71 via the emitter connection of the transistor 70. A resistor 95 functions as a load resistor in the collector branch of transistor 94.

In this circuit arrangement both the periodic signal and the collector direct current of the transistor 50, from which the charging current of the first capacitor 68 is derived, are led via the compensator stage 85. however, this does not affect the signal as a function of time.

In the case when the first capacitor 68 is installed away from the further components of the circuit arrangement, a junction point 96, for example as a connecting contact of an integrated circuit, is provided between them.

Figure 5:
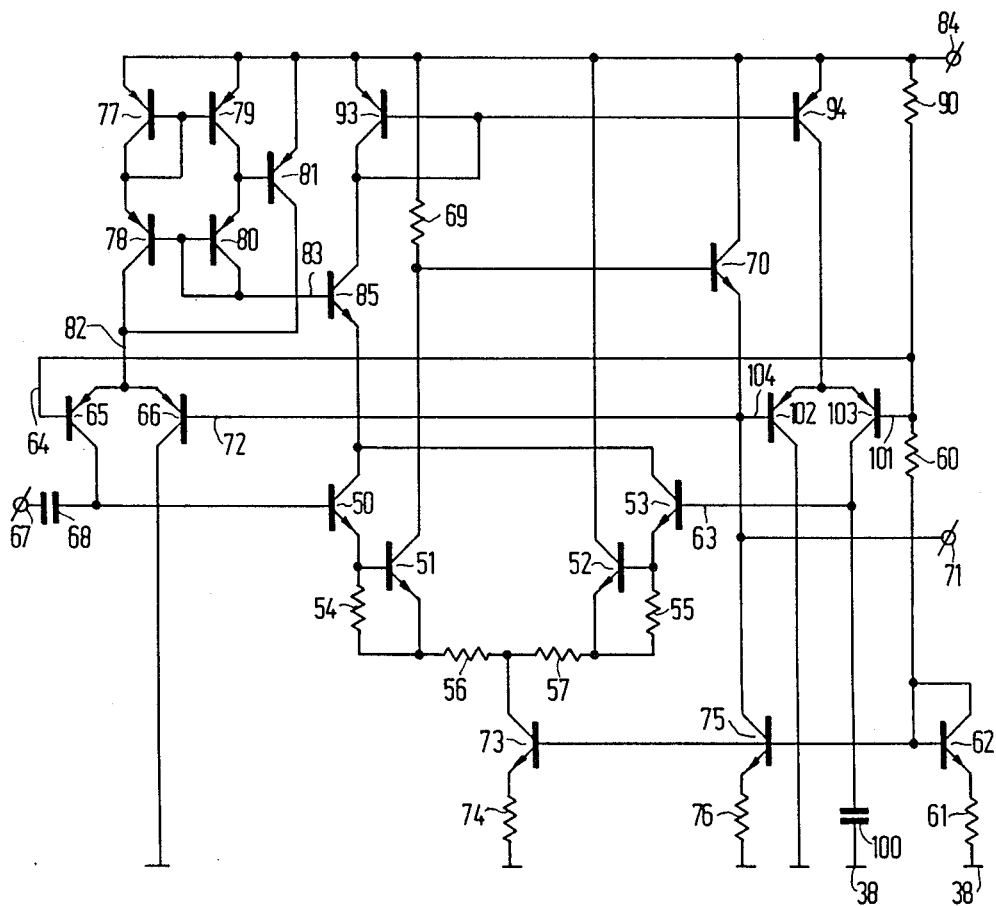
FIG. 5 shows an embodiment of the invention comprising a first and a second capacitor.

FIG. 5 shows an embodiment of a circuit arrangement comprising the first capacitor 68, which functions as a storage means and as a coupling capacitor, as well as a second capacitor 100 connected with its first terminal to ground and with its second terminal to the comparative value input 63 of the two-stage differential amplifier 50 to 57, whilst these and other components of the circuit arrangement bearing the same reference numbers correspond to the associated components of FIGS. 3 and 4. Especially the first capacitor 68, the limit value stage 65, 66, the current mirror circuit 77 to 81 with its outputs 82, 83, the supply voltage terminal 84, the compensator stage 85, the two-phase differential amplifier 50 to 57, the output stage transistor 70 as well as their current sources 73, 74 and 75, 76, respectively, are identical to those in FIG. 3, so that charging and discharging of the first capacitor in the circuit arrangement according to FIG. 5 takes place according to FIG. 3. With respect to the embodiments according to FIG. 3, the capacitance of the first capacitor 68 is certainly reduced considerably so that by the change in the charge of the first capacitor a sawtooth-like voltage occurs there, which has the same frequency as the periodic signal and which is superposed thereon.

The voltage divider comprising the resistors 60, 61, 90 and the transistor 62 connected as a diode have been borrowed from the circuit arrangement according to FIG. 4. It supplies a constant voltage to the limit value input 64 of the limit value stage 65, 66 and to a limit value input of a further limit value stage comprising two transistors 102, 103. A signal input 104 is accordingly connected to the output 71. Thus, the limit value stage 65, 66 and the further limit value stage 102, 103 work in parallel, whilst the further limit value stage 102, 103 is assumed to the second capacitor 100 and supplies a charging current thereto when the voltage at output 71 exceeds the voltage supplied by the voltage divider 60, 61, 62, 90 and corresponds to the limit value. A discharging current of capacitor 100 flows via the comparative value input 63 of the differential amplifier 50 to 57. The currents for discharging the capacitors 68, 100 and their capacitances are determined such that at the comparative input 63 the same sawtooth-like voltage is available as at the base of the transistor 50. Thus, the influence of the sawtooth-like voltages on the amplified signal, derived via the load resistor 69 and the output stage transistor 70, is compensated for.

The ratio of the charging currents to the discharging currents of the first capacitor 68 is again independent of the current gain of the transistors comprised in the circuit because of the compensator stage 85. The sum of the collector currents of the transistors 50 and 53 is further reflected to the further limit value stage 102, 103 via the transistor pair 93, 94, of which the transistor 93 as in FIG. 4 is connected as a diode, and functions there as the charging current of the second capacitor 100. The ratio of this current to the discharging current of the second capacitor 100 does not include any compensation for the influence on the current gain of the transistors in the circuit arrangement shown. The ratio of the charging current of the second capacitor 100 to the charging current of the first capacitor 68, which is determined as the ratio of the current gain of the compensator stage 85 to the constant ratio of the currents at the outputs 82 and 83 of the current mirror circuit 77 to 81, is rather selected to have a tolerance, exceeding one, so that the second capacitor 100 is charged more rapidly than the first capacitor 68. Hence the voltage at the second capacitor will reach its final value before the voltage at the first capacitor 68 and will form a specific reference potential for this voltage.

Needless to say that also for the charging and discharging currents of the second capacitor 100 a compensation can be implemented depending on the ratio of these currents to the current gain of the transistors. As a variation of the circuit arrangement shown in FIG. 5 the current at the junction point of the emitter connections of transistors 102 and 103 can be derived from the second output 83 of the current mirror circuit 77 to 81. The transistors pair 93, 94 can then be eliminated.

As the capacitors 68, 100 can have very small capacitances, they are integrated on a wafer together with the remaining circuit arrangement.

Figure 6:
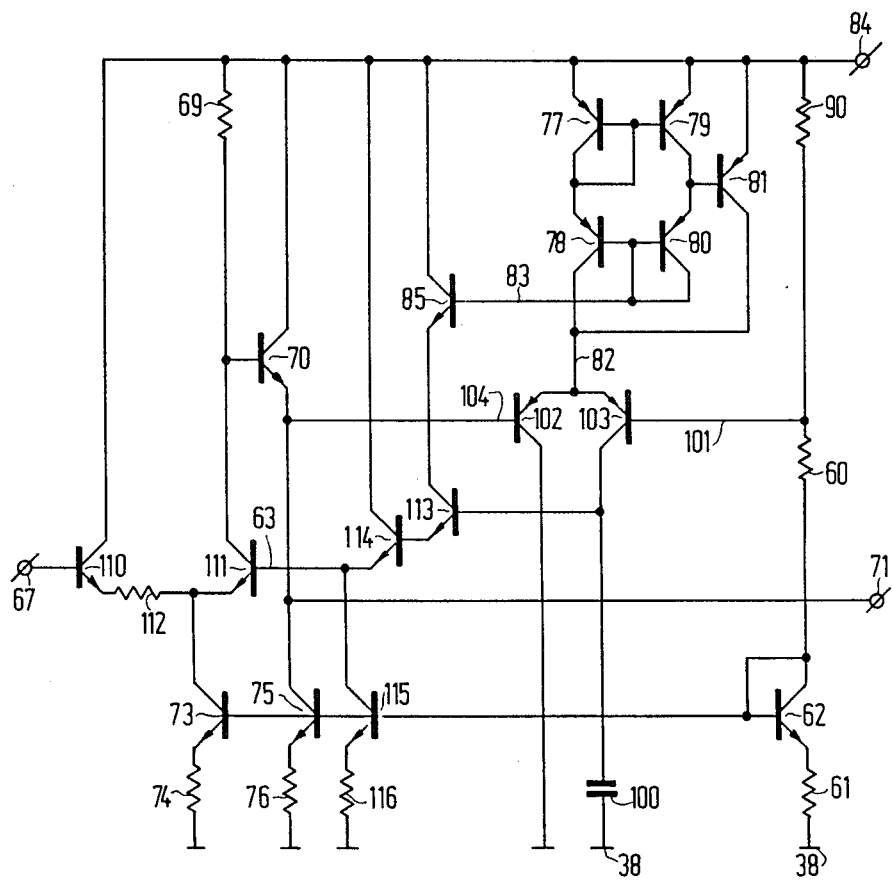
FIG. 6 shows an embodiment of the invention comprising an impedance transforming stage for reducing the current for discharging the storage means.

FIG. 6 shows an embodiment of the invention having only one (second) capacitor 100 between ground and the comparative value input 63 of a single-phase differential amplifier composed of two transistors 110, 111 and an emitter resistor 112. For the rest the components corresponding to the parts of the circuit arrangements described hereinbefore are again given the same reference numbers.

From the input 67 the periodic signal reaches the load resistor 69 via the differential amplifier 110 to 112 and is applied to the output 71 via the output transistor 70. The current supply of the differential amplifier 110 to 112 and of the output transistor 70 is again provided by the respective current sources 73, 74 and 75, 76, controlled by the voltage divider 60, 61, 62, 90, which, as in the circuit arrangement according to FIG. 5, applies a constant voltage to the limit value input 101 of the (further) limit value stage 102, 103. The signal input 104 of the (further) limit value stage receives the amplified signal from the output 71.

In the circuit arrangement shown the discharging current of the (second) capacitor 100 flows via the base-emitter paths of a respective first and second emitter-follower transistor 113 and 114, forming an impedance transformer stage, to the comparative value input 63. A current source likewise controlled by the voltage divider 60, 61, 62, 90 and comprising a transistor 115 and a resistor 116, provides the current for the impedance transformer stage 113, 114. As the emitter-follower transistors 113, 114 are arranged one after the other, the discharging current of the (second) capacitor 100 in the base connection of the first emitter-follower transistor 113 is merely the sum of the current in the comparative value input 63 of the differential amplifier 110 to 112 and of the current carried by the current source 115, 116, divided by the product of the current gains of the emitter-follower transistors 113 and 114. From this the factor is determined by which the (second) capacitor 100 can be made smaller with respect to its dimensioning in a circuit arrangement in which it is directly connected to the comparative value input 63. The capacitance of the (second) capacitor 100 can thus be reduced such that an integration with the further components of the circuit arrangement on a wafer is possible without the need of covering an overlarge surface area for same.

In the collector branch of the first emitter-follower transistor 113 again the compensator stage 85 is inserted consisting of a transistor as described, whose base current is reflected from the second output 83 of the current mirror circuit 77 to 81 to its first output 82 and constitutes there as described—incremented by a constant factor—a constant ratio with the discharging current of the (second) capacitor 100 which ratio does not depend on the current gains of the transistors and which base current constitutes thus the charging current of the (second) capacitor 100.

We claim:
1. A circuit arrangement for controlling a reference level within a periodic signal comprising:
 (a) an amplifying stage having at least one amplifier component to which said periodic signal is applied;
 (b) storage means for providing a mean value substantially corresponding to said reference level, said storage means being coupled to a control input of said amplifying stage;
 (c) charging and discharging means connected to said storage means, for providing charging and discharging currents to said storage means at a ratio with respect to each other which determines said mean value;
 (d) limit value means connected to said charging and discharging means, for comparing the value of said periodic signal at an output of said amplifying stage with a substantially constant limit value and thereby controlling said charging and discharging means; and
 (e) compensator means connected between said charging and discharging means and said storage means, for compensating for fluctuations in said ratio of charging current to discharging current.

2. The circuit arrangement of claim 1 wherein said amplifier component comprises a transistor stage.

3. The circuit arrangement of claim 2 wherein the compensator stage comprises a transistor stage having a current gain which effects the ratio of charging current to discharging current to compensate for fluctuations in said ratio caused by changes in the gain factor. components of which provide at least one gain factor which effects a current gain of the amplifying stage.

4. The circuit arrangement of claim 2 wherein the compensator means comprises at least one transistor having a current gain which effects the ratio of charging to discharging current to compensate for fluctuations in said ratio caused by changes in the gain factor.

5. The circuit arrangement of claim 1, wherein said amplifying stage comprises at least one transistor stage, the 6. A circuit arrangement for amplifying a periodic signal and for adjusting a reference level contained therein by determining this reference level, said circuit arrangement comprising an amplifier stage including an amplifier component, having a gain factor which effects the current gain of the amplifier stage, for amplifying the periodic signal; a limit value stage coupled to an output of said amplifier stage for comparing the amplified periodic signal to a substantially constant limit value and which generates a switching signal in dependence on whether a value of said amplified periodic signal exceeds or fails short of the limit value; a charging/discharging arrangement coupled to said limit value stage for alternatively providing a charging current or a discharging current dependent on said switching signal; and storage means coupled to said charging/discharging arrangement for receiving said charging current or said discharging current such that a mean value substantially corresponding to said reference level occurs across said storage means, wherein said mean value is applied to said amplifier stage for adjusting the reference level contained in said periodic signal, and further comprising a compensator stage coupled between said charging/discharging arrangement and said storage means for converting said charging and discharging currents by a compensation factor which is selected so that the ratio of the charging current to the discharging current is independent of the gain factor.

7. A circuit arrangement as claimed in claim 6, characterized in that said compensator stage comprises at least one transistor having a current gain which forms a constant ratio to the current gain of the amplifier stage.

8. A circuit arrangement as claimed in claim 6 or 7, characterized in that the storage means comprises a capacitor forming a coupling capacitor via which the periodic signal is applied to said amplifier stage.

9. A circuit arrangement as claimed in claim 8, characterized in that a capacitance of the capacitor is chosen in proportion to the discharging current such that the charge on the capacitor does not substantially change during a signal period.

10. A circuit arrangement as claimed in claim 6 or 7, characterized in that the storage means comprises a capacitor having a first terminal coupled to a reference point and a second terminal coupled to a comparative value input of said amplifier stage.

11. A circuit arrangement as claimed in claim 10, characterized in that a capacitance of the capacitor is chosen in proportion to the discharging current such that the charge on the capacitor does not substantially change during a signal period.

12. A circuit arrangement as claimed in claim 10, characterized in that an impedance transformer stage is arranged between the second terminal of said capacitor and the comparative value input of said amplifier stage.

13. A circuit arrangement as claimed in claim 6 or 7, characterized in that the storage means comprises a first capacitor forming a coupling capacitor via which the periodic signal is applied to said amplifier stage, and a second capacitor having a first terminal coupled to a reference point and a second terminal coupled to a comparative value input of said amplifier stage, wherein capacitances of said first and second capacitors are chosen in proportion to the associated discharging current such that the effects of said discharging current on the periodic signal during a signal period are eliminated.

14. A circuit arrangement as claimed in claim 13, characterized in that in each signal period, the second capacitor is charged more rapidly than the first capacitor.

* * * * *